United States Patent [19]

Drummond

[11] 4,220,906
[45] Sep. 2, 1980

[54] DIELECTRIC THERMAL POWER CONVERTER

[75] Inventor: James E. Drummond, Coronado, Calif.

[73] Assignee: Maxwell Laboratories, Inc., San Diego, Calif.

[21] Appl. No.: 785,836

[22] Filed: Apr. 8, 1977

Related U.S. Application Data

[63] Continuation-in-part of Ser. No. 605,346, Aug. 18, 1975, abandoned.

[51] Int. Cl.² .......................................... H02N 1/00
[52] U.S. Cl. ................................. 322/2 A; 310/300; 310/306; 310/308
[58] Field of Search .................... 337/298; 335/7, 11; 320/1; 310/306, 308, 300; 136/205, 212; 322/2 A

[56] References Cited

U.S. PATENT DOCUMENTS

| | | | |
|---|---|---|---|
| 2,719,265 | 9/1955 | McAlan | 320/1 X |
| 2,979,551 | 4/1961 | Pack | 320/1 X |
| 2,985,700 | 5/1961 | Johnston | 136/239 X |
| 3,194,024 | 7/1965 | Bassett | 136/212 X |
| 3,582,693 | 6/1971 | O'Hare | 310/10 |
| 3,610,970 | 10/1971 | Skinner | 310/308 |
| 3,737,688 | 6/1973 | O'Hare | 310/300 |
| 3,773,564 | 11/1973 | Yamaka et al. | 136/239 X |
| 3,899,359 | 8/1975 | Stachurski | 136/212 X |
| 3,971,938 | 7/1976 | O'Hare | 310/308 |
| 4,074,129 | 2/1978 | O'Hare | 310/308 |
| 4,087,735 | 5/1978 | O'Hare | 322/2 A |
| 4,096,393 | 6/1978 | Sher | 322/2 A |

Primary Examiner—Edward A. Miller
Attorney, Agent, or Firm—Fitch, Even & Tabin

[57] ABSTRACT

A method and apparatus is disclosed for use in converting heat to electrical energy and comprises a plurality of capacitors which have a temperature dependent capacitance. Heat is used to decrease the dielectric constant in the capacitors causing charge to expand from the capacitors into an associated circuit and do electrical work. The invention also includes reeds which are caused to vibrate by the flow of vapor carrying heat between stages. These reeds serve as thermal switches which pulse heat at the proper frequency and phase through a large number of stacked capacitors. The efficiency of the apparatus is optimized by operating the individual capacitors through cycles approximating Carnot cycles.

14 Claims, 7 Drawing Figures

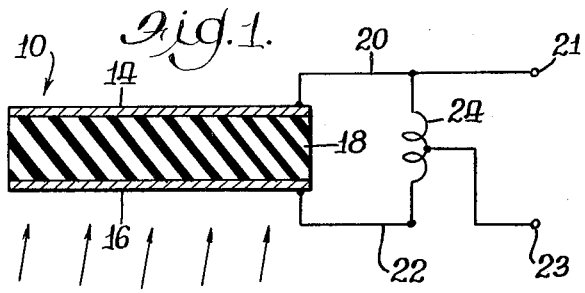
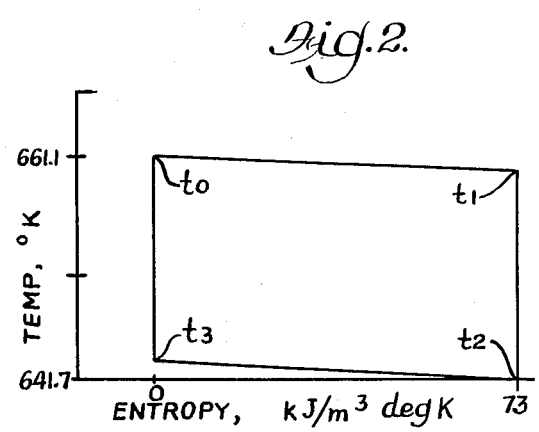
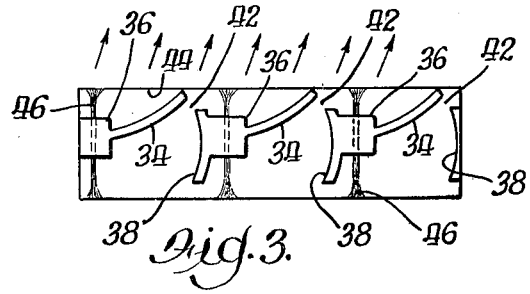
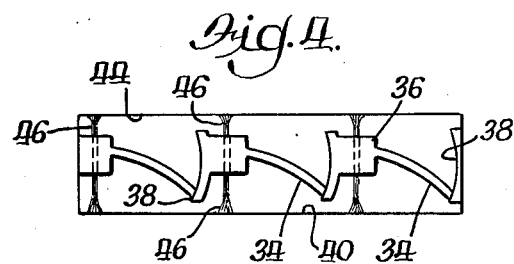
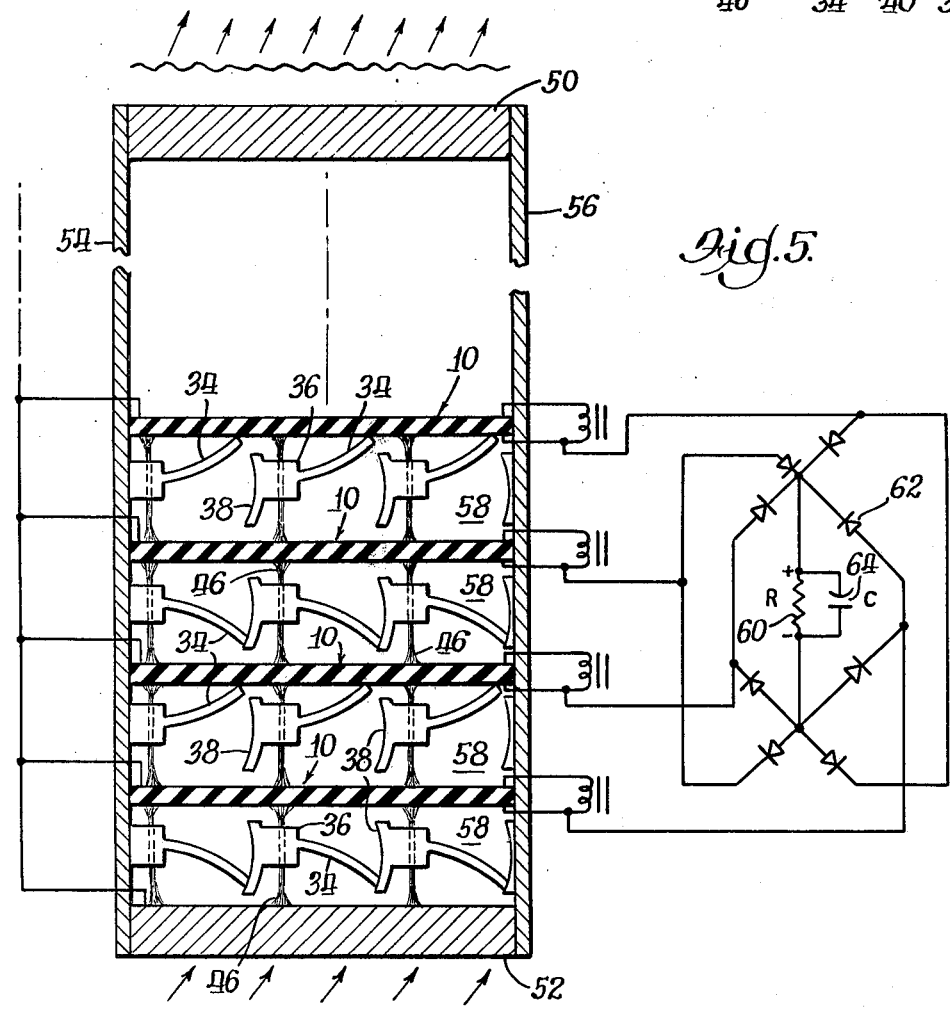

DIELECTRIC THERMAL POWER CONVERTER

CROSS REFERENCE TO RELATED APPLICATION

This application is a continuation-in-part of application Ser. No. 605,346, filed Aug. 18, 1975, and now abandoned.

This invention generally relates to capacitors and energy conversion and, more particularly, to apparatus for efficiently converting heat energy to electrical energy with a very small investment of materials and energy required for construction of the conversion system.

The improvement of operating efficiency in electrical generating apparatus has been the subject of dedicated engineering effort through the years so that at present incremental improvement is won at high cost in materials and energy investment. In the high temperature stages of steam turbines, for instance, above 1,000° F., exotic, high cost materials that retain great strength and corrosion resistance at these temperatures are required. In the low temperature stages of a steam turbine (like those used in central power stations) the low steam pressures require very large turbine blades in order to utilize the heat remaining at these temperatures. Again, the cost of materials and energy required to construct the heat engine is great. Furthermore, additional machinery, the dynamo, is required to convert the shaft rotation provided by the turbine into electrical power. The present invention generally relates to efficiently converting heat to electrical energy by thermally cycling a plurality of capacitors. Since the working substance is a solid rather than a gas or vapor, it has very high density without accompanying high pressures or temperatures. As a result of its high density, the working substance requires little volume to handle large power flows. This means that the amount of material required to surround the working substance such as walls, valves or turbine components is greatly reduced. As a result of the relatively low working temperature, 735° F., and extremely low gauge pressures required, about 0.1 atmospheres, inexpensive, mundane materials can be used to house the converter. No second, mechanical-to-electrical, conversion process is required, i.e., no dynamo. The result is a converter requiring very low mass and energy investment and, potentially, of very low cost.

The apparatus can utilize waste heat from auxiliary gas turbines used at central power stations or can be combined with steam turbine stages to improve overall efficiency. Further, its potentially low capital cost may mean that solar or geothermal energy can be used to provide the required heat input. Specifically, heat is used to thermally cycle capacitor dielectric material having a temperature dependent dielectric permittivity to thereby derive useful electrical energy. While the concept of deriving electrical energy by thermally cycling dielectric materials has been known and explored in theory and experiment, the small efficiencies that have been heretofore experienced have precluded their use in any practical application for producing electrical energy. The only previous practical use is believed to have been in measuring instruments where power efficiency was of little concern.

Accordingly, it is an object of the present invention to provide an improved dielectric thermal power converter to generate electrical energy in sizable quantities, utilizing waste heat from other generating means, or from burners, or from natural sources such as geothermal or solar power.

Other objects and advantages will become apparent upon reading the following detailed description, while referring to the attached drawings, in which:

FIG. 1 is an idealized schematic diagram illustrating one capacitor subjected to heating and cooling pulses and having electrical connections schematically illustrated, which represents one embodiment of the present invention;

FIG. 2 is a graph illustrating the dynamic thermal cycle of a 28 micrometer thick sample of crystalline lead titanate doped with lanthanum;

FIGS. 3 and 4 are idealized plan views of representative heat pulsing switches which are shown in opened and closed positions, respectively;

FIG. 5 is an idealized plan view of a stack of capacitors showing the cascade flow of heat through several stages and interstage, heat pulsing regions which represents the preferred embodiment of the present invention;

Figure 6:
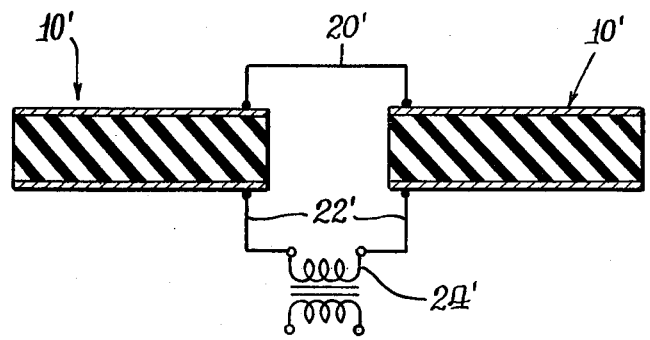
FIG. 6 is an idealized schematic diagram of a pair of capacitors connected together, which represents another embodiment of the present invention; and, FIG. 7 is an idealized plan view of a stack of capacitors similar to that shown in FIG. 5, but having power sources for operating the apparatus as a refrigerator.

Broadly stated, the present invention is directed to a method and apparatus for converting heat to electrical energy by using the heat energy to move electrical charge without passing the energy through an intermediate mechanical form. The present invention utilizes capacitors that have a dielectric material with a temperature dependent permittivity; this causes charge to be alternately expelled from and attracted onto it, doing electrical work as the capacitor is thermally cycled. A positive or negative temperature coefficient can be used, but for simplicity in the following discussion, language appropriate to a negative temperature coefficient will be used without implying a restriction to negative values. The method aspects of the present invention involve cycling the system through what closely approximates a Carnot cycle for optimum efficiency. Since a Carnot cycle is reversible, the system may be reversed to function as a refrigerator if desired. The present invention also includes cascading a plurality of capacitors together and includes unique heat switching means for controlling the transfer of heat between adjacent capacitors.

The basis for utilizing the dielectric of a capacitor as the working substance of a heat engine is easily understood from the basic relationship that the voltage, $V$, of a capacitor having charge $q$ on it is inversely proportional to the permittivity, $\epsilon$, of the dielectric of the capacitor:

$$V = qw/\epsilon A \qquad (1)$$

where $w$ is the thickness of the dielectric and $A$ is its area. If $\epsilon$ decreases upon heating, the voltage increases and charge can flow out of the capacitor to do electrical work. Thus, the dielectric serves to convert the thermal energy directly into electrical energy, and the present invention employs various arrangements of components as well as a method to practice the conversion in an efficient and practical cyclic manner.

Of practical significance is the fact that the thermal power converters of the present invention are adapted to utilize waste heat from large engines, such as presently utilized auxiliary gas turbines of power stations or single stage steam turbines which might in the future be specially designed as topping cycles for use with the present invention. In such applications, the present invention can utilize the cooling facilities such as sea surface water pumped to central power stations of coastal cities. Unlike steam turbines which become uneconomically bulky if they efficiently utilize lower temperatures than about 100° F., the present invention is capable of such utilization without this penalty. Thus, the present invention can produce about an extra 3% more power just by utilizing the waste heat from present day, full scale central power stations by cooling to 60° F. where sufficiently low temperature water is available. This would reduce the environmental impact in the immediate vicinity of the warm water return. For instance, deep ocean water can be utilized for cooling with return to higher levels which would be at about the same temperature as the return flow.

Additionally, the output of the dielectric thermal power converters is in the form of alternating current electrical energy. The frequency of the alternating current is a function of the speed with which the capacitors are cycled through the temperature range, and for some uses it may be preferred that the frequency be 60 hertz so as to coincide with the typical operating frequency of commercially available electricity, although other operating frequencies may be used.

Prior to discussing the detailed operation and structure of the apparatus and method of the present invention, it should also be understood that while a single capacitor can be driven through a thermal cycle to produce a given amount of electricity, the usefulness of the invention from a practical standpoint resides in producing significant quantities of electrical energy that results from effectively cascading or combining a large number of capacitors. In accordance with another aspect of the present invention, a unique switching mechanism operates to permit and prohibit vapor flow and therefore heat flow between adjacent capacitors. The switching mechanism effectively pulses heat to each capacitor in a stack; the switches are actuated by the flow of vapor which they modulate in much the same way that the metal reeds of a harmonica are actuated by and modulate the flow of air through the orifices they span. The power required for operation of the switches is small compared with the power generated by the stages served by the switches so the switches effectively permit the cascading of a plurality of capacitors to provide a substantial output. The total output of the converter is also a function of the efficiency of the thermal cycle through which the individual converter stages are moved and, in accordance with an important aspect of the present invention, a Carnot cycle is preferred, for the reason that the greatest total efficiency is achieved with simplicity of structure and operation.

The present invention is directed to a method and apparatus for converting heat to electrical energy by cyclically manipulating the temperature and entropy of a capacitor that has a dielectric with temperature dependent permittivity. The configuration of the capacitors as well as the other structure that will be described can be either a single set of cascaded capacitors electrically connected in a manner hereinafter described, or pairs of sets of cascaded capacitors can be utilized. Both embodiments of the present invention will be described herein, as will the heat switching means for each of the embodiments and the use of the Carnot cycle for optimizing the efficiency of operation.

Turning now to the drawings, and specifically to FIG. 1, the simplest embodiment of the present invention is shown to comprise a capacitor, indicated generally at 10, which has electrically conductive upper and lower plates 14 and 16, respectively, which are separated by a layer of dielectric material 18 of a type that has a temperature dependent permittivity. In other words, the dielectric material 18 is such that the capacitance of the capacitor 10 varies substantially over a temperature range of 10° to 20° C. For example, a composition of crystalline lead titanate with 7% lanthanum doping can be used for the dielectric material. At temperatures below that at which the peak dielectric permittivity occurs, i.e., the Curie temperature, $T_c$, the material is ferroelectric and the permittivity is a nonlinear function of field strength and is quite dissipative if hysteresis is allowed to occur. Above the Curie temperature, none of these qualities are exhibited. For small charge densities, the dielectric permittivity is given by $$\epsilon^{-1} = \gamma(T - T_0) \tag{2}$$

where T is temperature, $T_0$ is a temperature lower than the Curie temperature, and $\gamma$ is another constant. For lead titanate, $\gamma$ is $10^6$ meters per farad per degree kelvin, and $T_0 = 614°$ K. For strontium titanate, $T_0 \approx 0°$ K. By mixing lead and strontium titanates, the value of the Curie temperature can be linearly altered with composition. As the temperatures of a charged capacitor employing any of these titanate dielectrics is increased above its Curie temperature, the capacitance decreases rapidly. If the charge cannot escape, then the voltage across the capacitor plates must rapidly increase. The voltage across the capacitor is given by equation (1) previously set forth herein. When $\epsilon$ decreases upon heating, the voltage, V, increases and charge can flow out of the capacitor to do electrical work. If the capacitor were connected across the terminals of a battery, then the charge would escape and the battery would receive electrical energy as a result of the heating of the capacitor. Thus, the dielectric serves to convert thermal energy directly into electrical energy. With respect to the capacitor 10 shown in FIG. 1, it is alternately cooled and heated so that the charge is driven back and forth through electrical lines 20 and 22. Because of the net energy added each cycle by heating as the capacitor discharges and cooling as it charges, the oscillations will grow in amplitude until limited by power output to a load connected across terminals 21 and 23. An inductor 24 interconnected between lines 20 and 22 performs a function analogous to that of a flywheel in an ordinary reciprocating steam engine in that it recharges the capacitor (though in reverse polarity) after its voltage has fallen to zero like the flywheel recompresses the vapor after the piston has reached the end of its stroke. It should be recognized that if a thin capacitor is used, the temperature cycling of the capacitor 10 can be achieved by applying heat alternately to the lower plate 16 during the heating portions of the cycles and when the cooling portions of the cycles are to be performed, similar pulses can be alternately extracted from the upper plate 14. Thus, from a practical standpoint, the application of a heat source can be separate and independent of the application of a source of cooling fluid or a heat sink.

FIG. 2 illustrates a representative thermodynamic cycle which a 28 micro-meter thick sample of lead titanate dielectric executes as a result of application of the present method of heat-to-electrical power conversion at a rate of 120 cycles per second. Starting at the upper left corner of the diagram at the point labeled $t_0$, the lower surface of the fully charged capacitor of FIG. 1 is exposed to sulfur vapor at 661.1° K. while the upper surface is sealed from vapor escape. As the capacitor discharges into the inductor 24, its temperature tends to fall by reason of the electro-caloric effect but is restrained by condensation of the sulfur which delivers heat increasing the entropy of the dielectric. After about 2.1 milliseconds, 30% of the charge has left the capacitor (at $t_1$); the source of sulfur vapor is then cut off and the temperature falls rapidly during the next quarter of a cycle without further change of entropy. When the capacitor is fully discharged at $t_2$, the current passing through the external inductor begins to force reverse charging of the capacitor. During the third quarter cycle, the upper surface of the capacitor is unsealed so that liquid sulfur on it may evaporate, cooling the capacitor, lowering its entropy back to its original value at $t_3$ and limiting the temperature rise caused by the electro-caloric effect during charging. After about 70% of full reverse charge has been received by the capacitor, its upper surface is again sealed to prevent escape of sulfur vapor; during the final quarter of the thermal cycle (from $t_3$ to $t_0$), the temperature rises back to the starting value as the electrical charge returns to its initial magnitude but reverse sign. One thermal cycle is then completed which is one half of an electrical cycle and the process continues. The area within the diagram in FIG. 2 represents the heat energy that is transformed into electrical energy each time the thermal cycle is executed. Half of this energy is developed in the load connected to the terminals 21 and 23 and half is dissipated by electrical conduction within the dielectric itself. This internal dissipation does not occur to a significant extent at temperatures below about 500° K. because the resistivity of the dielectric becomes very great at lower temperatures. Additional dissipation occurs because of molecular friction as dipoles within the dielectric alter their orientation during the cycle. This hysteresis dissipation is limited by the inductance in the external circuit which restricts the rate of polarization change. It is well known that hysteresis can be fully observed only in circuits of the Sawyer and Tower type in which the capacitor under observation is electrically connected to other capacitors which are able to supply charge very quickly as the capacitor under test undergoes spontaneous reversal of polarization which can occur in as little as one micro-second. In the present case, such rapid polarization reversal is greatly slowed by the inductor 24 which alters the voltage across the capacitor 10 to a point of stability. A measure of this limitation is supplied by the oscillation period of the resonant circuit, 17 milliseconds. The circuit allows complete polarization reversal in one-half of this period. If the spontaneous reversal time is about 10 microseconds, then less than about 5% of the energy generated in the thermal cycle previously described is dissipated by internal friction; the remainder is stored in the inductor.

While the foregoing discussion made use of doped crystalline lead titanate, it should be understood that other materials in either crystalline or ceramic form can be utilized. Also materials which have long range ordering of a symmetry axis but not complete crystalline symmetry can be utilized.

The mechanism shown in FIGS. 3 and 4 provides the thermal switching which is required to achieve the heating and cooling sequences of the surfaces of the capacitor 10 of FIG. 1. A number of representative members are shown which consist of spring reeds 34 and support sections 36, the latter of which are fixed in position by attachment to rigid walls out of the plane of the figures and therefore not shown. The support sections 36 have contoured surfaces 38 which closely match most of the extent of the arcs swept out by the tips of the reeds 34 as they vibrate. The tops of the surfaces 38 are shortened to permit the tips of the reeds 34 to swing clear of them at the peak of their vibration. This vibration is caused by a flow of vapor produced at a heated surface 40 which is supplied with liquid by wicks 46. The heat causes evaporation of the liquid which exerts pressure against the reeds in their closed positions (see FIG. 4) and escapes through an opening indicated at 42 relieving pressure when the reeds are open as shown in FIG. 3. This is essentially the same action that occurs when the thin (~0.3 mm) brass reeds of a harmonica are actuated except that in the present case, the structure abutting the reeds is contoured to fit the reed more precisely and in such a way as to permit vapor to escape only during one quarter of the reeds' vibration period. The sealing of the small gap between each reed tip in its closed position and the contoured surface 38 abutting it is produced by coating each of these surfaces with triboelectrically active material such as asbestos which is very high in the triboelectric series or teflon which is extremely low in this series. Thus, almost any liquid in contact with the exposed surface would donate electrons (to teflon) or take electrons (from asbestos) and will thereby be held by electric dipole forces onto the surface. The extent of the dipole layer, called the Helmholtz double layer, into the liquid is given approximately by the Debye length, $$\lambda_D = \sqrt{\epsilon_l kT/ne^2} \tag{3}$$

where $\epsilon_l$ is the dielectric permittivity of the liquid, k is Boltzmann's constant, T is temperature measured from absolute zero, n is the density of electrical charge carriers, and e the magnitude of their charge. For insulating materials like sulfur, $$n = 2 \times (2\pi mkT/h^2)^{3/2} e^{-W/kT} \tag{4}$$

where m is the mass of an electron, h is Planck's constant and W is an activation energy characteristic of the material. From measurements of the resistivity of liquid sulfur, W is found to be 1.0 eV. This gives $\lambda_D = 2.3$ μm at T=661° K.; $\lambda_D = 4.4$ μm at T=617° K. It has been found that layers of high resistivity ash about a centimeter thick were precipitated onto surfaces and later electrically pulled off. Also, it was found that the stalagmites of ash pulled off cleanly from metal surfaces, but when pulled from triboelectrically active insulating material covering metal surfaces stubs of 10 to 20 μm length remained adhering to the material. The Debye length from equations (3) and (4) for that case is 13 μm. The several thousand molecular layers clinging to the reed tips and abutting members 38 are much thicker than those that would be retained by ordinary Van der Waal's forces of adhesion; the thick liquid layers thereby provide good vapor seals as well as lubrication for the brushing action of the reeds along their abutting surfaces.

The switches need not be separated from one another by partitions because a phase control mechanism exists which keeps the reeds synchronized. This is the periodic absorption of heat and temperature decline of the capacitor which is placed above the switch. The dielectric of the capacitor undergoes alternate polarization and depolarization as a result of the electrical oscillations of the circuit of which it is a part. As the capacitor discharges, it absorbs heat if heat is available, otherwise its temperature falls, both situations of which will be described with respect to the graph of FIG. 2. As temperature falls on any surface bounding a small volume containing vapor near its dew point, the vapor pressure falls rapidly. Thus the pressure above the reed switch undergoes rapid periodic variations as the capacitor charges and discharges. The magnitude of these variations is given approximately by the empirical expression for the equilibrium vapor pressure, $p_e(T)$, of the fluid in the region of the switches. For example, in the case of sulfur, $$p_e(T) = 1.38 \times 10^{10} e^{-L/kT} n/m^2 = 1.38 \times 10^{10} e^{-8,357° K./T} n/m^2 \quad (5)$$

where L=69.5 megajoules per kilogram mole is the effective heat of vaporization of the dominant vapor molecule, $S_8$. As shown in FIG. 2 at $t_1$, the temperature of the capacitor begins to fall rapidly and with it, according to equation (5), the vapor pressure falls. During the 2.1 ms required to go from $t_1$ to $t_2$, the temperature falls 17° K. and the pressure falls by more than 12,000 newtons per square meter-a little more than a tenth of an atmosphere. The temperature and pressure remain relatively constant during the next 2.1 ms required to go to $t_3$, and then rise rapidly to $t_0$ and then change slowly back to their initial values as $t_1$ is again reached. Thus, the pressure above the reeds is periodic due to the oscillating charge on the capacitor above them. The frequency of this oscillation is controlled by the inductor and the capacitor. The reeds are tuned so that the natural resonant frequency of their free mechanical vibration would be a little lower than the frequency of the pressure variations. As for any harmonic oscillator driven at a frequency substantially above its natural free vibration frequency, the reeds response is about 180° out of phase with the driving force, the exact value depending upon the Q of the free vibration and the wave shape of the driving force. Thus, when the pressure above the reeds is low, during the period from $t_2$ to $t_3$, the net upward force on the reeds will be largest and the reeds will be at the lowest part of their swing as shown in FIG. 4. When the pressure above the reeds is large, from $t_0$ to $t_1$, the net upward force will be minimum and the reeds will be at the topmost part of their swing, opening the vapor control areas 42 as shown in FIG. 3. This provides the pulse of heating vapor at just the time it is needed during the thermal cycle.

The temperature cycling of the capacitor also would produce vapor pressure variations at its upper surface. If identical reed switches are placed above the capacitor, they would automatically open during just the times when cooling is needed by the capacitor, i.e., during the interval $t_2$ to $t_3$ shown in FIG. 2. During this interval the upward force on those reeds would be minimum so they would be at the top of their swing, opening their valve areas 42. Thus, the reeds above and below an electrically oscillating capacitor will be driven 180° out of phase with each other and at just the proper phases to provide the condensation heating and evaporative cooling required for a near Carnot cycling of the capacitor. If another capacitor were inserted above the first with reed switches between them, then the evaporation pulses which cool the lower of the two capacitors could be used as heating pulses for the upper capacitor. The only requirement is that the two capacitors be 180° out of phase in their thermal cycles, i.e., 90° out of phase in their electrical cycles which operate at half the thermal frequency. This would occur automatically if either one of the two capacitors were initially driven by an outside electrical power source at the proper frequency while heat was supplied below the lowest plane of switches and extracted above the highest set of switches. After start-up, the system would be self-regulating as long as heating and cooling continued and as long as liquid was available below each layer of switches.

To maintain the availability of liquid below each layer of switches it is preferred that wicks be used which return liquid condensing above each plane of thermal switches to the surface below the plane. The wicks 46 are shown in FIGS. 3 and 4 as being located in apertures in the supports 36 and extend from the upper surface 44 to the lower surface 40. The wicks are to be made of densely packed fiber bundles which span the separation between the condensing surface above a layer of thermal switches and the evaporative surface below this layer. The wicks preferably flare out at each surface for optimum liquid return. The wicks are preferably located so that the spacing between adjacent wicks is within 1 cm to about 2 cm. In order to prevent vapor flow through the penetration holes, the holes must be tightly stuffed with the fiber bundles and the fibers should be thoroughly wet with the returning liquid to form a good vapor seal. This wetting action can be assured by choosing the fiber material to be at either extreme of the triboelectric series. Then a Helmholtz charge double layer will form in any liquid adjacent to this material. Liquid in the double layer is in a lower potential energy state and so will cling to the fiber. At the temperatures considered herein, asbestos fibers are preferred and, at lower temperatures, teflon can also be used.

It should be clear from the foregoing discussion that the process of utilizing the evaporative cooling pulses from one capacitor as the source of condensation heating for the next can be continued until the temperature of the heat rejected from the final stage is just above the temperature of the coldest heat sink available, a cascade of a number of capacitors is shown in FIG. 5.

The apparatus of FIG. 5 has upper and lower ends 50 and 52, respectively, which are preferably made of aluminum and may have a thickness of about 2 mm. The side walls 54 and 56, as well as the front and end walls (not shown) are made of a thermally and electrically insulating material and can be alumina $Al_2O_3$ or Quartz, for example. The walls define a closed container and the capacitors 10 are fixedly attached within the walls so as to seal each chamber 58 containing the planar array of switches therewithin. While only three switches are shown within each chamber, it should be understood that a larger or smaller number may be used. The overall dimensions of the cascaded unit shown in FIG. 5

(and FIG. 7) is typically about $4'' \times 4'' \times 16\frac{1}{4}''$ but can be as little as about $1'' \times \frac{1}{2}'' \times 10''$. With the cascaded apparatus successful operation can be achieved with only about 2% of the heat flowing into any one capacitor being converted to electrical energy. A twenty-two stage cascade is described in detail in Table 1. A multi-stage unit has a desirable attribute in that the interstage coupling is very effective. More particularly, as little as 1.7 cm separate adjacent stages and little temperature drop occurs in the majority of inter-stage regions. Moreover, the thermal switches have good reliability and long life, and the amount of material required is small. Each of these points will be discussed herein.

A detailed state-by-interstage analysis of the apparatus of FIG. 5 is given in Table 1. The second column states the mole fraction percent of lanthanum and strontium introduced to provide the value of the parameter $T_o$, given in the third column, which maximizes the power output for each stage. Between stages, the second column states the interstage heat transfer fluids that were used. The fourth column gives the input temperature to all stages and interstage regions. The fifth column gives the heat input to each stage and interstage region. Many stages after the first are unable to accept the full heat flux rejected from the previous stage so their area is increased as shown in column six.

TABLE 1

| Stage | Materials | $T_o$,K | $T_{in}$,K | $\Delta A$, kW | A,m² | $T_{out}$,K | T,kw |
|---|---|---|---|---|---|---|---|
|  | 2 mm aluminum |  | 663.6 | 163.0 |  | 662.2 |  |
|  | $S_8$ + He |  | 662.2 | 163.0 |  | 661.1 |  |
| 1 | 6.7% La | 614.2 | 661.1 | 163.0 | 1.00 | 641.7 | 1.9 |
|  | $S_8$ + He |  | 641.7 | 161.1 |  | 639.7 |  |
| 2 | 8% La | 593.2 | 639.7 | 161.1 | 1.05 | 620.9 | 2.9 |
|  | $S_8$ + He |  | 620.9 | 158.2 |  | 617.5 |  |
| 3 | 9.4% La | 571.4 | 617.5 | 158.2 | 1.07 | 599.3 | 3.4 |
|  | $C_{14}H_{10}$ + He |  | 599.3 | 154.8 |  | 598.9 |  |
| 4 | 9.4% La + 2.7% Sr | 553.3 | 598.9 | 154.8 | 1.08 | 581.2 | 3.5 |
|  | $C_{14}H_{10}$ + He |  | 581.2 | 151.3 |  | 580.6 |  |
| 5 | 9.4% La + 5.4% Sr | 535.3 | 580.6 | 151.3 | 1.08 | 563.4 | 3.5 |
|  | $C_{14}H_{10}$ + He |  | 563.4 | 147.8 |  | 562.5 |  |
| 6 | 9.4% La + 8.1% Sr | 517.6 | 562.5 | 147.7 | 1.09 | 545.8 | 3.5 |
|  | $C_{14}H_{10}$ + He |  | 545.8 | 140.3 |  | 544.2 |  |
| 7 | 9.4% La + 10.8% Sr | 499.6 | 544.2 | 144.3 | 1.10 | 528.0 | 3.4 |
|  | $C_{14}H_{10}$ + He |  | 528.0 | 140.9 |  | 525.0 |  |
| 8 | 9.4% La + 3.6% Sr | 480.9 | 524.0 | 140.9 | 1.11 | 509.4 | 3.3 |
|  | $C_{14}H_{10}$ + He |  | 509.5 | 137.6 |  | 502.8 |  |
| 9 | 9.4% La + 16.9% Sr | 459.2 | 502.8 | 137.6 | 1.13 | 487.8 | 3.3 |
|  | $C_{14}H_{10}$ + He |  | 487.8 | 134.3 |  | 467.2 |  |
| 10 | 9.4% La + 22.1% Sr | 424.4 | 467.2 | 134.3 | 1.18 | 453.2 | 3.2 |
|  | $C_7H_8O$ + He |  | 453.2 | 131.1 |  | 453.0 |  |
| 11 | 9.4% La + 24.2% Sr | 410.5 | 453.0 | 131.1 | 1.19 | 439.4 | 3.1 |
|  | $C_7H_8O$ + He |  | 439.4 | 128.0 |  | 439.0 |  |
| 12 | 9.4% La + 26.2% Sr | 396.8 | 439.0 | 128.0 | 1.20 | 425.8 | 3.1 |
|  | $C_7H_8O$ + He |  | 425.8 | 124.9 |  | 425.2 |  |
| 13 | 9.4% La + 28.3% Sr | 383.3 | 425.2 | 124.9 | 1.20 | 412.4 | 3.0 |
|  | $C_2H_2Cl_4$ + He |  | 412.4 | 121.9 |  | 412.2 |  |
| 14 | 9.4% La + 30.2% Sr | 370.6 | 412.2 | 121.9 | 1.21 | 399.8 | 2.9 |
|  | $C_2H_2Cl_4$ + He |  | 399.8 | 119.0 |  | 399.6 |  |
| 15 | 9.4% La + 32.1% Sr | 358.2 | 399.6 | 119.0 | 1.22 | 387.6 | 2.9 |
|  | $C_2H_2Cl_4$ + He |  | 387.6 | 116.1 |  | 387.2 |  |
| 16 | 9.4% La + 33.9% Sr. | 346.2 | 387.2 | 116.1 | 1.23 | 375.5 | 2.8 |
|  | $C_2H_2Cl_4$ + He |  | 375.5 | 113.3 |  | 374.9 |  |
| 17 | 9.4% La + 35.7% Sr | 334.9 | 374.1 | 113.3 | 1.23 | 363.6 | 2.7 |
|  | $H_2O$ + He |  | 363.6 | 110.6 |  | 363.6 |  |
| 18 | 9.4% La + 37.3% Sr | 323.1 | 363.6 | 110.6 | 1.24 | 352.6 | 2.7 |
|  | $H_2O$ + He |  | 352.6 | 107.9 |  | 352.6 |  |
| 19 | 9.4% La + 32.9% Sr | 312.3 | 352.6 | 107.9 | 1.25 | 341.9 | 2.6 |
|  | $H_2O$ + He |  | 341.9 | 105.3 |  | 341.8 |  |
| 20 | 9.4% La + 40.5% Sr | 301.8 | 341.8 | 105.3 | 1.25 | 331.5 | 2.5 |
|  | $H_2O$ + He |  | 331.5 | 102.8 |  | 331.3 |  |
| 21 | 9.4% La + 42.1% Sr | 291.6 | 331.3 | 102.8 | 1.26 | 321.3 | 2.5 |
|  | $H_2O$ + He |  | 321.3 | 100.3 |  | 320.9 |  |
| 22 | 9.4% La + 43.6% Sr | 281.3 | 320.9 | 100.3 | 1.27 | 311.2 | 2.4 |
|  | $H_2O$ + He |  | 311.2 | 92.9 |  | 310.4 |  |
|  | 2 mm Aluminum |  | 310.4 | 97.9 |  | 309.7 |  |
|  |  |  |  |  |  | total | 65.1 |

Summary:
input heat 163 kW @ 663.6 K = 734.9° F.
output heat 97.9 kW @ 309.7 K = 97.9° F.
output electricity 65.1 kW 60Hz or dc
% of Carnot efficiency 74.8%
net overall efficiency* 39.9%

The thermal reed switches referred to in Table 1 are 1.9 cm long, at least about 1 cm in width and 0.1 mm in thickness and are made of AISI type 302 stainless steel which flex by plus and minus 26° during operation.

Alternatives are to bypass the extra heat to the output heat sink or to thicken the dielectrics of the lower stages to enable them to make use of all the heat available to them. The choice of increasing the area of the lower stages is most efficient, but does require extra structure.

The seventh column shows the temperature of the heat rejected from each stage and interstage region. The eighth column gives the net electrical power developed by each stage allowing for resistive and residual hysteresis losses in the dielectrics, resistive losses in the electrodes and cycle losses due to less-than-optimum heat pulsing. The temperature drop in each stage is the sum of that produced by the electro-caloric effect and that required to drive the very large heat fluxes into the 28 μm thick dielectrics. The maximum opening (indicated at 42 in FIG. 3) is 2.5 mm. This results in a pressure drop in the vapor flow of less than 600 newtons per square meter which requires a temperature drop of only 0.9° K. An additional 0.1° K. drop occurs at each liquid-vapor interface in the region pulsing heat to the first stage. The worst case is between the ninth and tenth stages where a total of 20.6° K. is lost and it is preferred that the heat transfer fluid there be anthracene, $C_{12}H_{10}$. Helium is preferably added to each interstage region in sufficient quantity to make the total pressure nearly one atmosphere in each inter-stage region to limit stresses. The 26° flexure of the reeds does not exceed the stress endurance limit of the steel used and the reeds will thereby have an essentially infinite fatigue lifetime and wear and corrosion are small because of the controlled atmosphere and the lubricated wiping contract. Any small departures from the optimum heat pulsing make only second order decreases in the efficiency of the dielectric power conversion and a 5% reduction in efficiency is taken into account in the power produced by every stage in Table 1. The natural time constant by free polarization reversal of the dielectrics has been taken to be 10 μs. This results in about another 5% power loss for each stage of Table 1. The power produced by each stage also takes into account the previously discussed internal conduction power loss. Resistive losses in the 1 μm thick electrodes was calculated and found to be negligible. Gold is preferred as the electrode material on the highest temperature regions because it does not combine with sulfur at these temperatures. Silver is preferred at intermediate temperatures because of its good conductivity but lower cost than gold. Copper is preferred in the lower temperature regions where its conductivity is adequate because of the excellent long term stability of copper-water heat pipes. The mass of the entire unit, including packaging is less than about 100 kg.

A variety of heat transfer fluids are shown in Table 1. Sulfur is used because of its stability in the highest temperature range. Lower temperature loss is obtained using anthracene below 600° K.; benzyl alcohol below 453° K.; tetrachloroethane below 412° K. and water below 364° K. The fluids used in each stage are determined by the temperature. A fluid cannot be used if the temperature in that stage is above the boiling temperature of the fluid being considered.

A number of power extraction circuits have been described, including using taps across all or part of the inductor associated with the thermally cycled capacitors and inductive coupling utilizing the magnetic field of the inductor. The loads can be simple resistors, or they can be rectifiers such as resistor 60 shown in FIG. 5 in conjunction with the diodes 62. They can also contain reactive elements such as capacitor 64 and they can be placed in series with the inductor or combinations of the foregoing can be used. For some purposes for instance, it may be desirable to insert an idling capacitor in series with the inductor to alter the non-linear relationship between voltage and charge which is typical of ferroelectric capacitors. Without the idling capacitor, the waveform of the voltage across the inductor would be nonsinusoidal; with it the waveform can be made close to sinusoidal. The power-consuming part of the load, which may require a sinusoidal voltage, can be placed in parallel with the inductor or in the secondary circuit of the transformer.

Turning now to another embodiment of the invention, FIG. 6 shows a pair of capacitors 10' substantially similar to the capacitor 10 in FIG. 1 and are shown to be oppositely charged and connected together via wires 20' and 22' and inductor 24' which serves as the primary of a transformer the secondary of which is available for connection of the load. As thermal switches below the pair of capacitors open, they drive charge of one sign out of capacitor 10 and charge of the opposite sign out of capacitor 12 thus doubling the voltage applied to inductor 24. It is clear that this pairing can also be employed in parallel cascades of the type discussed in detail earlier. The transformer primaries 24 can be rotated by 90° in each succeeding stage so as to produce two magnetic fields oriented at right angles with respect to each other. The electrical connections can be kept entirely within the sealed package of the cascade, magnetic fields coupling the power out to two or more secondary coils located around or adjacent to the cascade.

Figure 7:
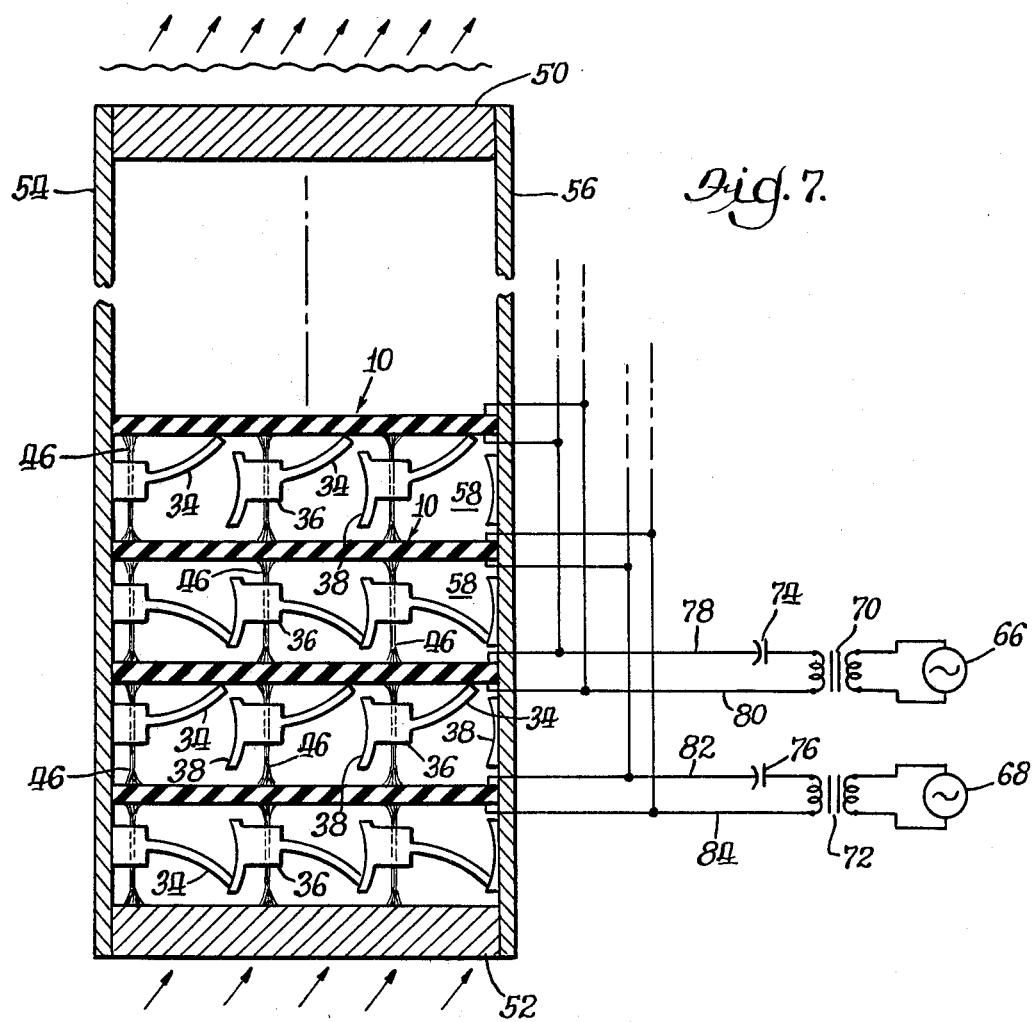

Turning now to another aspect of the present invention, and referring to FIG. 7, the cascade of converters can be utilized in a reverse conversion process to operate as a refrigeration apparatus if the load previously indicated is replaced by one or more alternating current sources 66 and 68 of electrical power driving the capacitors through transformers 70 and 72, capacitors 74 and 76 and lines 78, 80, 82 and 84 as shown. The phase of the output of the current sources 66 and 68 are 90° out of phase with respect to each other. The sources drive the capacitors at a frequency below the natural resonant frequency of the reed switches, so that these switches will open at opposite phases to those described earlier. The switches below a capacitor will open to admit vapor when the capacitor is at the coolest part of its cycle and the switches above the capacitor will open to permit the escape of vapor when the capacitor is at the hottest part of its cycle. Heat will thus be pumped from a cool suface below the capacitor to a hotter surface above the capacitor. The thermal cycle of FIG. 2 is thereby executed in reverse order. Charge is extracted adiabatically from the fully charged capacitor when both of the switches above and below the capacitor are closed. This would take the capacitor from the point $t_0$ in FIG. 2 to the point $t_3$ whereupon the switches below the capacitor would open; vapor condensation on the lower surface of the capacitor would then hold the capacitor to nearly a constant temperature until the point $t_2$ is reached. At this point the lower switch reeds would return to close contact with the contoured surfaces cutting off the flow of vapor. Just at this time when the capacitor would be completely discharged, the inductor and external power source would begin recharging the capacitor with reverse polarity; its temperature would rise rapidly, due to the electro-caloric effect, to the point $t_1$. At this point the reeds of the switches above the capacitor will have reached the upper extent of the abutting contoured surface and will allow the escape of fluid evaporating from the upper surface of the capacitor. This will provide sufficient cooling that the temperature of the capacitor will rise little as it continues to full recharge at the point $t_0$. Thus heat deposited in the capacitor at low temperature is elevated in temperature by the electro-caloric effect and removed at high temperature. In the cascade of FIG. 7 a very large temperature interval can be spanned. As stated before, the load, the rectifier in FIG. 5, is replaced in the refrigeration apparatus of FIG. 7 by electrical power sources of suitable frequency and the proper 90° phase difference between adjacent capacitors in the stack.

From the foregoing detailed descriptions, it should be understood that a significant improvement in the art of generating electricity has been shown and described which is operable to produce electricity utilizing heat from a variety of sources including heat rejected from generators which operate at higher temperature in order to produce greater overall conversion efficiency. The used of the Carnot cycle in the operation of the thermal power converter, coupled with the manner in which the capacitors can be cascaded together by use of unique switching means, contributes to the significant advantages and desirable attributes that have been heretofore described.

Although preferred embodiments have been illustrated and described, various modifications, alternatives and equivalents thereof will become apparent to those skilled in the art and, accordingly, the scope of the invention should be defined only by the appended claims and equivalents thereof.

Various features of the invention are set forth in the following claims.

What is claimed is:

1. A dielectric thermal power converter comprising:
   a plurality of capacitors, said capacitors being spaced apart and positioned in a stack, each of said capacitors having electrically conductive surfaces separated by a layer of dielectric material having a temperature dependent permittivity;
   an electrical circuit means including a connection between said surfaces of each of said capacitors, said connection having an inductance means in series therein;
   heat input and output end walls for receiving and rejecting heat and spaced from the first capacitor and last capacitor in the stack, respectively;
   fluids for transferring heat between adjacent capacitors and from said input wall to the first capacitor, and from the last capacitor to said output wall of said stack;
   side walls enclosing and isolating said fluids within the volumes between adjacent capacitors of said stack and between said input wall and the first capacitor, and between the last capacitor and said output wall of said stack;
   switching means positioned intermediate said adjacent spaced capacitors and between said heat input wall and the first capacitor, and between the last capacitor and said heat output wall of said stack and adapted to synchronously open and close to alternately communicate and block vapor flow, respectively, between adjacent surfaces to thereby cycle heat input and output of the dielectric material of each of said capacitors in synchronism with discharging and charging of each capacitor, respectively;
   wicks positioned intermediate said spaced, adjacent capacitors and between said heat input wall and the first capacitor, and between the last capacitor and said output wall of said stack and adapted to conduct liquid between adjacent surfaces; and,
   means associated with said inductance means for driving an electrical load.

2. A power converter as defined in claim 1 wherein said inductance means comprises an input winding of a transformer and said load driving means comprises a secondary winding of said transformer.

3. A power converter as defined in claim 1 wherein said load driving means comprises taps on said inductance means.

4. A power converter as defined in claim 1 wherein said load driving means comprises a pair of terminals in series with said electrical circuit connection.

5. A power converter as defined in claim 1 wherein said dielectric material is a mixture of lead titanate and strontium titanate.

6. A power converter as defined in claim 1 wherein said dielectric material is lanthanum doped lead titanate.

7. A power converter as defined in claim 1 wherein said fluids are selected from the group consisting of:
   helium mixed with sulfur, helium mixed with anthracene, helium mixed with benzyl alcohol, helium mixed with tetra-chloroethane, and helium mixed with water.

8. A power converter as defined in claim 7 wherein said switching means comprises a plurality of elongated, flexible, thin members fixed at one of their ends and free to move in close proximity to contoured surfaces at the other of their ends, said members being bendable between open and closed positions in response to vapor pressure differences from side to side of each of said members.

9. A power converter as defined in claim 8 wherein said members have a natural resonant frequency below twice the oscillation frequency of said electrical circuit means.

10. A power converter as defined in claim 9 wherein said members are stainless steel tipped with a triboelectrically active material and said contoured surfaces are coated with a triboelectrically active material.

11. A power converter as defined in claim 10 wherein said triboelectrically active material is asbestos.

12. A power converter as defined in claim 10 wherein said triboelectrically active material is teflon.

13. A dielectric thermal power converter comprising a plurality of power converters as defined in claim 1 operated with said load driving means connected in series so that their load driving voltages add.

14. A dielectric thermal power converter comprising a plurality of power converters as defined in claim 1 operated with said load driving means connected in parallel so that their load driving currents add.

* * * * *

UNITED STATES PATENT AND TRADEMARK OFFICE
CERTIFICATE OF CORRECTION

PATENT NO. : 4,220,906
DATED : September 2, 1980
INVENTOR(S) : James E. Drummond It is certified that error appears in the above-identified patent and that said Letters Patent are hereby corrected as shown below:

Column 10, TABLE I, under heading designated MATERIALS, line 17, "3.6%Sr" should read --13.6%Sr--.

Column 10, TABLE I, heading "T,kw" should read --P,kW--.

Signed and Sealed this

Fourteenth Day of April 1981

[SEAL]

Attest:

RENE D. TEGTMEYER

*Attesting Officer*  *Acting Commissioner of Patents and Trademarks*